(12) United States Patent
Li et al.

(10) Patent No.: US 11,271,064 B2
(45) Date of Patent: Mar. 8, 2022

(54) DISPLAY PANEL, MANUFACTURING METHOD THEREOF, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zihua Li, Beijing (CN); Jing Liu, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/438,576

(22) Filed: Jun. 12, 2019

(65) Prior Publication Data
US 2020/0105856 A1    Apr. 2, 2020

(30) Foreign Application Priority Data
Sep. 27, 2018 (CN) .......................... 201811134280.X

(51) Int. Cl.
*H01L 27/32* (2006.01)
*H01L 51/52* (2006.01)

(52) U.S. Cl.
CPC ...... *H01L 27/3276* (2013.01); *H01L 27/3288* (2013.01); *H01L 51/5237* (2013.01); *H01L 51/5246* (2013.01); *H01L 2251/5392* (2013.01)

(58) Field of Classification Search
CPC ............. H01L 27/3276; H01L 27/3288; H01L 51/5237; H01L 51/525; H01L 2251/5392; H01L 51/5246
See application file for complete search history.

(56) References Cited

U.S. PATENT DOCUMENTS

| | | | | |
|---|---|---|---|---|
| 7,808,176 | B2* | 10/2010 | Sakaguchi | H01L 51/5253 313/506 |
| 9,123,676 | B2* | 9/2015 | Han | H01L 27/3246 |
| 2014/0367658 | A1* | 12/2014 | Kwak | H01L 27/1218 257/40 |
| 2016/0141548 | A1* | 5/2016 | Tanaka | H01L 51/5246 257/40 |
| 2017/0294610 | A1* | 10/2017 | Sasaki | H01L 51/0097 |

* cited by examiner

*Primary Examiner* — Aaron J Gray
(74) *Attorney, Agent, or Firm* — Leason Ellis LLP

(57) ABSTRACT

A display panel, a manufacturing method thereof, and a display device are provided. The display panel includes: a first base substrate including a packaging region; a plurality of support portions located in the packaging region, a first interval being provided between adjacent support portions; a plurality of conductive lines located at a side of the plurality of support portions away from the first base substrate; a packaging layer located at a side of the plurality of conductive lines away from the first base substrate; and a second base substrate arranged opposite to the first base substrate and bonded with the first base substrate by the packaging layer.

17 Claims, 10 Drawing Sheets

DISPLAY PANEL, MANUFACTURING METHOD THEREOF, AND DISPLAY DEVICE

CROSS REFERENCE TO RELATED APPLICATIONS

The present application claims priority to the Chinese patent application No. 201811134280.X filed on Sep. 27, 2018, the entire disclosure of which is incorporated herein by reference as part of the present application.

TECHNICAL FIELD

At least one embodiment of the present disclosure relates to a display panel, a manufacturing method thereof, and a display device.

BACKGROUND

An Organic Light-Emitting Diode (OLED) display is an organic electroluminescent device, which has the advantages of simple manufacturing process, low cost, self-luminescence, high luminous efficiency, etc.

SUMMARY

At least one embodiment of the present disclosure relates to a display panel, a manufacturing method thereof, and a display device.

At least one embodiment of the present disclosure provides a display panel, including: a first base substrate including a packaging region; a plurality of support portions located in the packaging region, a first interval being provided between adjacent support portions; a plurality of conductive lines located at a side of the plurality of support portions away from the first base substrate; a packaging layer located at a side of the plurality of conductive lines away from the first base substrate; and a second base substrate arranged opposite to the first base substrate and bonded with the first base substrate by the packaging layer.

In some embodiments, each of the plurality of support portions is in direct contact with one of the plurality of conductive lines.

In some embodiments, an orthographic projection of the conductive line on the first base substrate falls within an orthographic projection of the support portion on the first base substrate.

In some embodiments, an area of the orthographic projection of the conductive line on the first base substrate is less than or equal to an area of the orthographic projection of the support portion on the first base substrate.

In some embodiments, the packaging layer includes a portion located between opposite side surfaces of adjacent conductive lines.

In some embodiments, the packaging layer further includes a portion located between opposite side surfaces of the adjacent support portions.

In some embodiments, a gap is provided between the adjacent support portions.

In some embodiments, a size of each of the plurality of support portions in a direction perpendicular to the first base substrate is greater than or equal to a size of each of the plurality of conductive lines in a direction perpendicular to the first base substrate.

In some embodiments, a ratio of a size of each of the plurality of support portions in a direction parallel with the first base substrate to a distance between the adjacent support portions in a direction parallel with the first base substrate is 0.5-2.

In some embodiments, a second interval is provided between adjacent conductive lines, and the second interval is greater than the first interval.

In some embodiments, a blocking portion is further provided between opposite side surfaces of the adjacent support portions, and a surface of the blocking portion away from the first base substrate is in contact with a surface of the packaging layer close to the first base substrate.

In some embodiments, each of the plurality of conductive lines includes a plurality of conductive sub-layers stacked in a direction perpendicular to the first base substrate.

In some embodiments, the conductive line includes three conductive sub-layers stacked in the direction perpendicular to the first base substrate, the three conductive sub-layers include a first conductive sub-layer, a second conductive sub-layer and a third conductive sub-layer arranged sequentially from the first base substrate, and a melting point of the second conductive sub-layer is less than a melting point of the first conductive sub-layer and a melting point of the third conductive sub-layer, respectively.

In some embodiments, a material of the first conductive sub-layer is Ti, a material of the second conductive sub-layer is Al, and a material of the third conductive sub-layer is Ti.

In some embodiments, the first base substrate further includes a display region, and the display region is surrounded by the packaging region.

In some embodiments, a display component is located in the display region, and the display component is a component to be packaged.

At least one embodiment of the present disclosure further provides a display device including any of the display panels as described above.

At least one embodiment of the present disclosure further provides a manufacturing method of a display panel, including: forming a plurality of support portions in a packaging region of a first base substrate, a first interval being provided between adjacent support portions; forming a plurality of conductive lines at a side of the plurality of support portions away from the first base substrate; coating a liquid packaging material in the packaging region, the liquid packaging material being located at a side of the plurality of conductive lines away from the first base substrate; arranging the first base substrate and the second base substrate opposite to each other; and performing a heating process to solidify the liquid packaging material to form a packaging layer, so that the second base substrate is bonded with the first base substrate.

In some embodiments, the manufacturing method further includes: forming a blocking portion between opposite side surfaces of the adjacent support portions, wherein a surface of the blocking portion away from the first base substrate is in contact with a surface of the packaging layer close to the first base substrate.

In some embodiments, the blocking portion is formed simultaneously with forming the plurality of support portions.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure without constituting any limitation thereto.

DETAILED DESCRIPTION

The technical solutions in the embodiments of the present disclosure will be clearly and completely described below in connection with the accompanying drawings in the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Figure 1A:
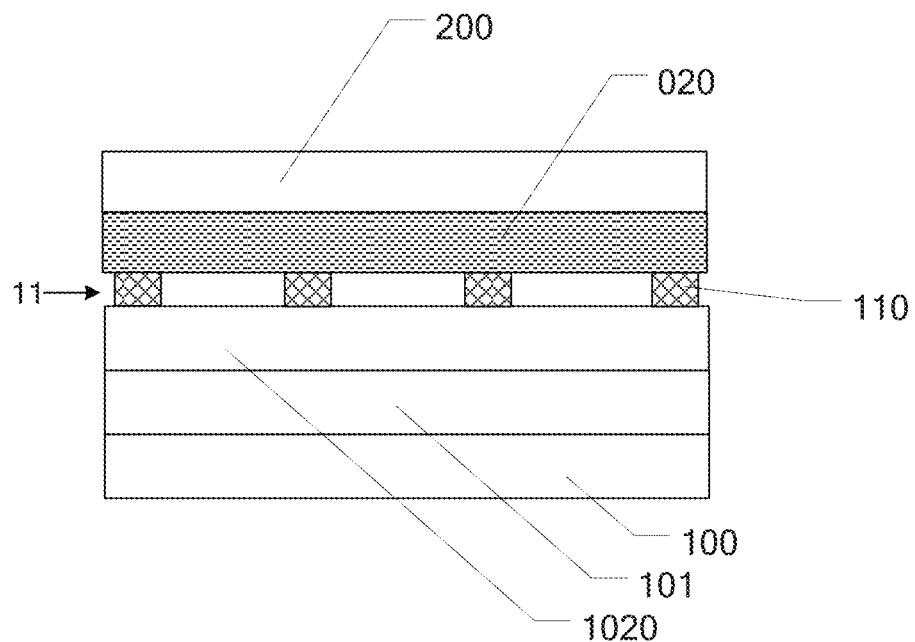
FIG. 1A is a cross-sectional view illustrating a packaging region of an OLED display panel before high temperature welding.

FIG. 1A is a cross-sectional view illustrating a packaging region of an OLED display panel before high temperature welding. The OLED display panel includes a first base substrate 100 and a second base substrate 200 arranged opposite to each other. The first base substrate 100 is provided with an insulation layer 101, an interlayer dielectric layer 1020 and a conductive line layer 11, and the conductive line layer 11 includes a plurality of conductive lines 110 insulated from each other. A liquid packaging material 020 is arranged between the first base substrate 100 and the second base substrate 200. For example, the liquid packaging material 020 includes an insulation material. For example, the liquid packaging material includes, but is not limited to, a liquid frit.

As illustrated in FIG. 1A, the liquid frit is difficult to fill in a space between adjacent conductive lines 110 due to poor fluidity of the liquid packaging material and a small size of the conductive line in a direction perpendicular to the first base substrate 100.

Figure 1B:
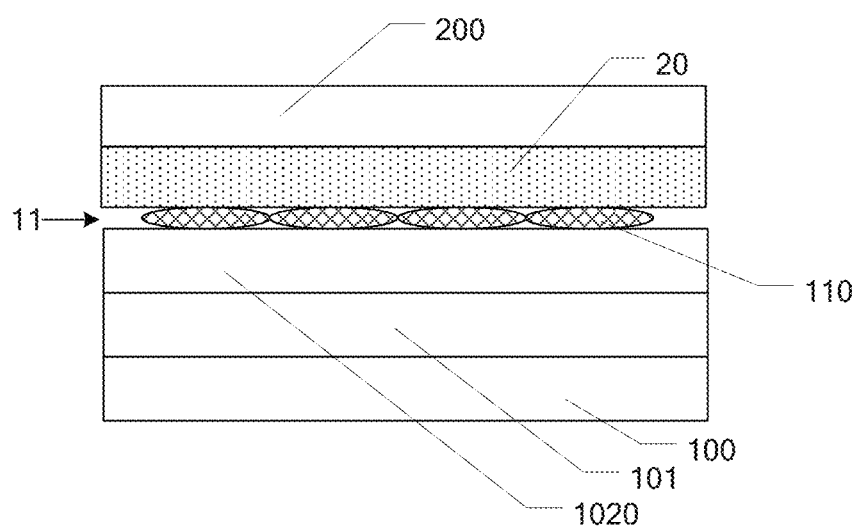
FIG. 1B is a cross-sectional view illustrating a short circuit caused by contact of adjacent conductive lines during high temperature welding.

FIG. 1B is a cross-sectional view illustrating a short circuit caused by contact of adjacent conductive lines during high temperature welding. As illustrated in FIG. 1B, the liquid packaging material is melted at a high temperature, and after cooling, a packaging layer 20 can be formed to bond the first base substrate 100 with the second base substrate 200. Because a high-temperature processing is required in the packaging process and the conductive line 110 includes a fusible metal, the fusible metal in the conductive line 110 is melted during the high-temperature processing, thus generating a risk of short circuit between adjacent conductive lines 110. A short circuit can cause line defect and abnormal driving of the display panel.

Figure 2A:
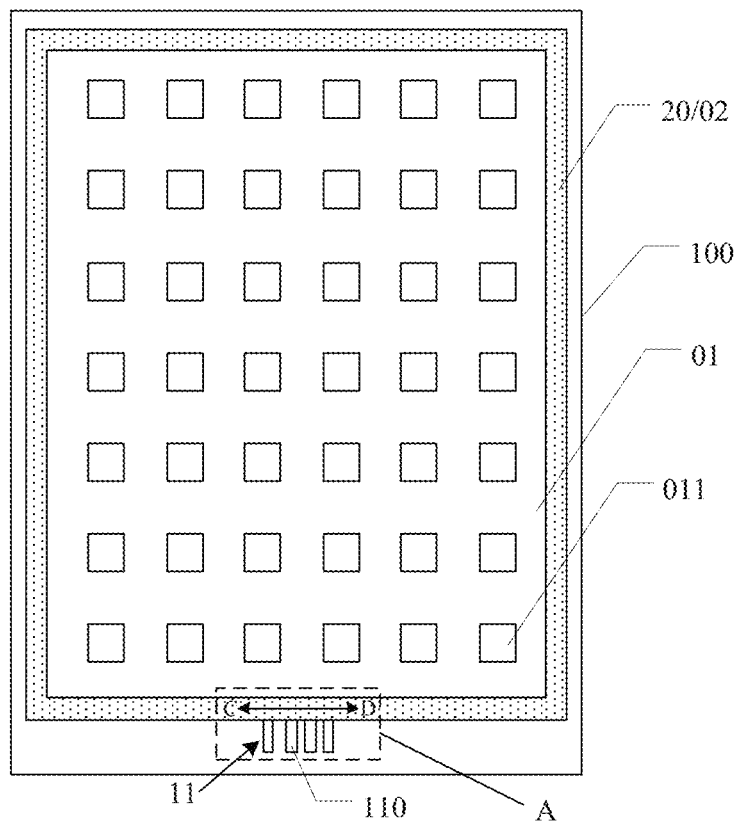
FIG. 2A is a plan view illustrating a display panel.

FIG. 2A is a plan view illustrating a display panel. The display panel includes a first base substrate 100 and a second base substrate 200 (not illustrated in FIG. 2A, referring to FIG. 3) arranged opposite to each other. The second base substrate 200 is bonded with the first base substrate 100 by the packaging layer 20. For the sake of clarity, the second base substrate is omitted in FIG. 2A. The display panel includes a display region 01 and a packaging region 02 surrounding the display region 01. For example, a region where the packaging layer 20 is located is the packaging region 02, and a region surrounded by the packaging layer 20 can be the display region 01. A plurality of display units are located in the display region 01 to achieve image display, and the plurality of display units may be arranged in an array. For example, the plurality of display units are located on the first base substrate 100. For example, the display unit includes a display component 011 such as an OLED, without limited thereto. For example, the display component is a component to be packaged. Four conductive lines 110 are illustrated in FIG. 2A, and the number of the conductive lines is not limited to that illustrated in FIG. 2A, but may be determined as required. FIG. 2A illustrates a rectangular display region 01 and an annular rectangular packaging region 02 surrounding the rectangular display region 01, however, the shapes of the display region 01 and the packaging region 02 are not limited to those illustrated in FIG. 2A.

As illustrated in FIG. 2A, a conductive line layer 11 is provided on the first base substrate 100. The conductive line layer 11 is located between the packaging layer 20 and the first base substrate 100. The conductive line layer 11 includes a plurality of conductive lines 110 insulated from each other. Each conductive line 110 extends from a side of the packaging layer 20 close to the display region 01 to a side of the packaging layer 20 away from the display region 01. For example, the display region 01 may include a plurality of gate lines and a plurality of data lines that are insulated from each other and intersected with each other to define a plurality of pixel regions. For example, a plurality of display units may be located in the plurality of pixel regions, respectively. For example, each conductive line may be connected with a gate line or a data line of the display region. For example, the conductive line may be integrally formed with the gate line or the data line, without limited thereto. The conductive lines may also be connected with other signal lines in the display region requiring to be input with a signal, without limiting the embodiments of this disclosure thereto.

Figure 2B:
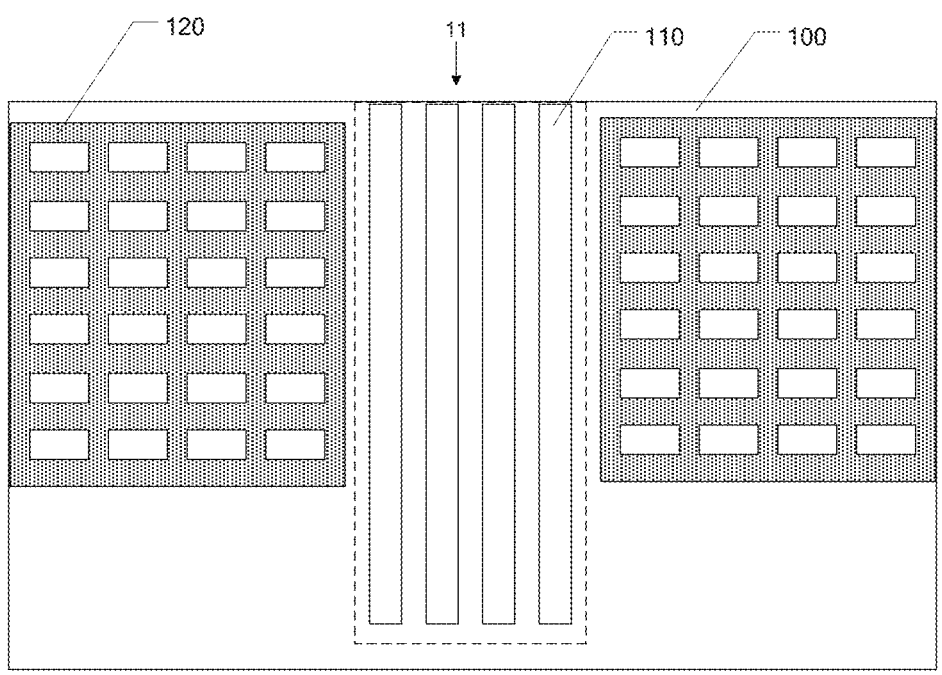
FIG. 2B is a plan view illustrating a structure below a packaging layer in the dashed box A illustrated in FIG. 2A.

FIG. 2B is a plan view illustrating a structure below a packaging layer in the dashed box A illustrated in FIG. 2A. As illustrated in FIG. 2B, an auxiliary layer 120 is provided on the first base substrate 100, and the auxiliary layer 120 may be configured to improve an adhesion force between the packaging layer and the first base substrate 100. The auxiliary layer 120 may be made of a metal material. As illustrated in FIG. 2B, the auxiliary layer 120 may be in a grid shape in a plan view. For example, in order to simplify manufacturing process, the auxiliary layer 120 may be formed in the same layer as a gate line in the display region. For example, in order to simplify manufacturing process, the conductive line layer 11 can be formed in the same layer as a data line in the display region. For example, the auxiliary layer 120 is located between the first base substrate 100 and the packaging layer 20. The auxiliary layer 120 may be in contact with the packaging layer 20.

Figure 3:
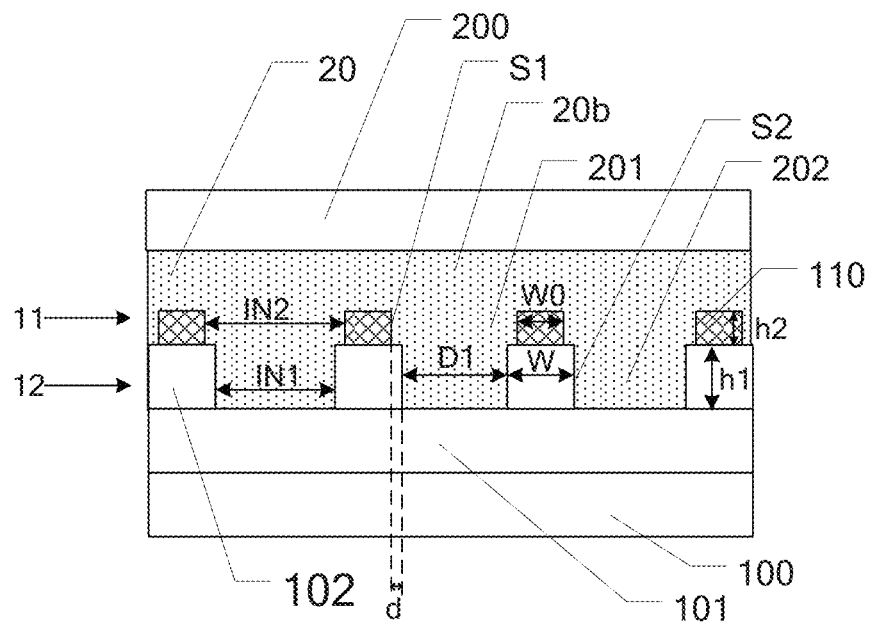
FIG. 3 is a cross-sectional view illustrating a display panel provided by an embodiment of the present disclosure (which may be a cross-sectional view taken along line C-D illustrated in FIG. 2A)

FIG. 3 is a cross-sectional view illustrating a display panel provided by an embodiment of the present disclosure. As illustrated in FIG. 3, the display panel includes a first base substrate 100, a second base substrate 200, and a packaging layer 20 located therebetween. The first base substrate 100 may be provided with a support layer 12 and a conductive line layer 11. The support layer 12 includes a plurality of support portions 102 located at a side of the first base substrate 100 close to the second base substrate 200. A plurality of support portions 102 are located in the packaging region 02 (referring to FIG. 2A), adjacent support portions 102 are separated from each other, and a first interval IN1 is provided between adjacent support portions 102. The conductive line layer 11 includes a plurality of conductive lines 110, and the plurality of conductive lines 110 are located at a side of the plurality of support portions 102 away from the first base substrate 100. For example, the plurality of conductive lines 110 are in one-to-one correspondence with the plurality of support portions 102, without limited thereto. The packaging layer 20 is located at a side of the plurality of conductive lines 110 away from the first base substrate 100. For example, the plurality of conductive lines 110 are insulated from each other. For example, the first base substrate 100 and the second base substrate 200 are both glass substrates, without limited thereto.

According to the display panel provided by the embodiment of the present disclosure, because the support portion 102 is arranged below the conductive line 110, and a first interval IN1 is provided between adjacent support portions 102, a space between the adjacent conductive lines 110 is expanded, and a liquid packaging material can flow into the space between the adjacent conductive lines 110 to separate the adjacent conductive lines, thereby reducing a risk of a short-circuit between the adjacent conductive lines under the packaging layer and achieving an effect of improving the yield of a display panel.

As illustrated in FIG. 3, adjacent conductive lines 110 are separated from each other, and a second interval IN2 is provided between the adjacent conductive lines 110. For example, as illustrated in FIG. 3, the second interval IN2 is greater than the first interval IN1.

As illustrated in FIG. 3, in order to facilitate an expansion of a space between adjacent conductive lines, the support portion 102 is in direct contact with the conductive line 110. For example, the support portion 102 is in direct contact with the conductive line 110 located directly above the support portion 102.

As illustrated in FIG. 3, because the first interval IN1 expands the space between the adjacent conductive lines 110 to facilitate the flow of the packaging material between the adjacent conductive lines 110, the packaging layer 20 includes a portion 201 located between opposite side surfaces S1 of the adjacent conductive lines 110. For example, a portion 201 of the packaging layer 20 located between the opposite side surfaces S1 of the adjacent conductive lines 110 is in contact with the side surface S1.

As illustrated in FIG. 3, because the first interval IN1 expands the space between the adjacent conductive lines 110 to facilitate the flow of the packaging material, the packaging layer 20 further includes a portion 202 located between opposite side surfaces S2 of adjacent support portions 102. For example, the portion 202 of the packaging layer 20 located between the opposite side surfaces S2 of the adjacent support portions 102 is in contact with the side surface S2.

For example, as illustrated in FIG. 3, a base portion 20b of the packaging layer 20, the portion 201 located between the opposite side surfaces S1 of the adjacent conductive lines 110, and the portion 202 located between the opposite side surfaces S2 of the adjacent support portions 102 are integrally formed.

As illustrated in FIG. 3, an insulation layer 101 may also be further arranged between the first base substrate 100 and the support layer 12. For example, a surface of the insulation layer 101 away from the first base substrate 100 may be a planar surface. For example, the insulation layer 101 may include at least one selected from the group consisting of a buffer layer, a gate insulation layer, and the like. For example, the insulation layer 101 is in contact with the plurality of support portions 102.

As illustrated in FIG. 3, the conductive line 110 is in contact with the packaging layer 20. For example, the conductive line 110 is wrapped by the packaging layer 20.

As illustrated in FIG. 3, in order to better expand the space between adjacent conductive lines 110, a size h1 of the support portion 102 in a direction perpendicular to the first base substrate 100 is greater than or equal to a size h2 of the conductive line 110 in the direction perpendicular to the first base substrate 100.

As illustrated in FIG. 3, a ratio of a size W of the support portion 102 in a direction parallel with the first base substrate 100 to a distance D1 (i.e., the first interval IN1) between the adjacent support portions 102 in the direction parallel with the first base substrate 100 is 0.5-2.

As illustrated in FIG. 3, a size W of the support portion 102 in the direction parallel with the first base substrate 100 is greater than a size W0 of the conductive line 110 in the direction parallel with the first base substrate 100. For example, a size W0 of the conductive line 110 in the direction parallel with the first base substrate 100 is 1-3 μm.

In some embodiments, the first interval IN1 is 2-5 μm. In some embodiments, the second interval IN2 is 3-6 μm.

In some embodiments, a size W of the support portion 102 in a direction parallel with the first base substrate 100 is designed to be 3-5 μm; a size h1 of the support portion 102 in a direction perpendicular to the first base substrate 100 is 0.7-1 μm.

For example, a size h1 of the support portion 102 in a direction perpendicular to the first base substrate 100 can be controlled by an etching time, and a dry etching process may be used to etch to form a plurality of support portions 102. The support portion 102 may be made of an insulation material. For example, the support portion 102 may be formed by etching an insulation material layer. In FIG. 3, for example, the first interval IN1 between adjacent support portions 102 is formed by forming a via hole penetrating the insulation material layer. For example, the support portion 102 located between adjacent via holes may be formed by forming via holes penetrating at least one insulation material layer. In some embodiments, the support portion may be formed in the form of a groove instead of a via hole penetrating the insulation material layer in a direction perpendicular to the first base substrate 100. In other embodiments, the support portion 102 may be formed by forming via holes penetrating a plurality of insulation material layers. For example, the insulation material layer may include at least one selected from the group consisting of a buffer layer, a gate insulation layer, and an interlayer dielectric layer.

Figure 4:
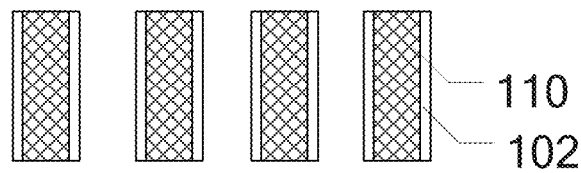
FIG. 4 is a plan view illustrating a conductive line and a support portion in a display panel provided by an embodiment of the present disclosure.

FIG. 4 is a plan view illustrating a conductive line and a support portion in a display panel provided by an embodiment of the present disclosure. As illustrated in FIG. 4, an orthographic projection of the conductive line 110 on the first base substrate 100 falls within an orthographic projection of the support portion 102 on the first base substrate 100. As illustrated in FIG. 4, an area of the orthographic projection of the conductive line 110 on the first base substrate 100 is less than an area of the orthographic projection of the support portion 102 on the first base substrate 100.

Figure 5A:
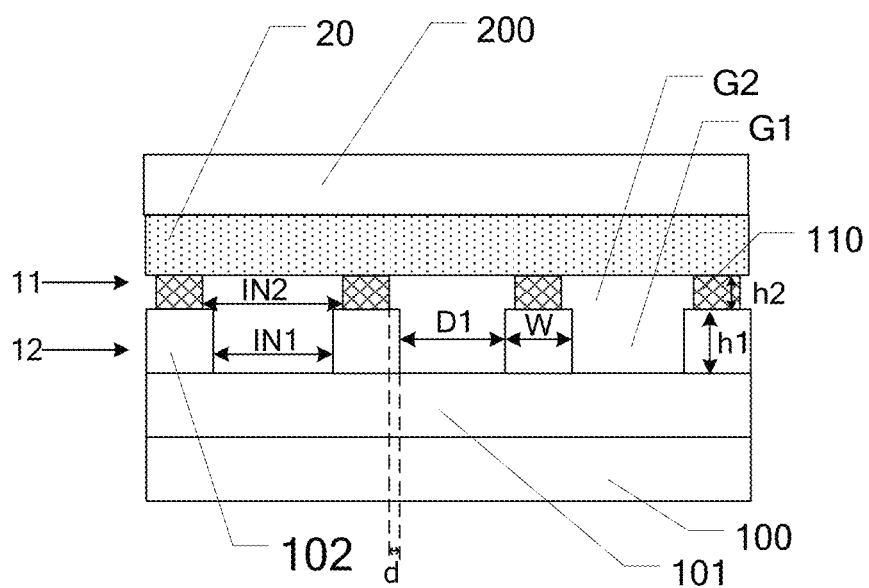
FIG. 5A is a cross-sectional view illustrating a display panel provided by another embodiment of the present disclosure.

FIG. 5A is a cross-sectional view illustrating a display panel provided by another embodiment of the present disclosure. In the case where a distance between adjacent conductive lines is small and a liquid packaging material cannot fill in a space between adjacent conductive lines 110, a gap G1 is provided between adjacent support portions 102 and a gap G2 is provided between adjacent conductive lines 110. As a result, when a high-temperature welding process is performed, a melted portion of the conductive line 110 can fall into the gap G1 and the gap G2, which can also reduce a risk of a short circuit between the adjacent conductive lines 110. For example, the gap refers to a hollowed-out region. For example, the gap is a space filled with gas.

Figure 5B:
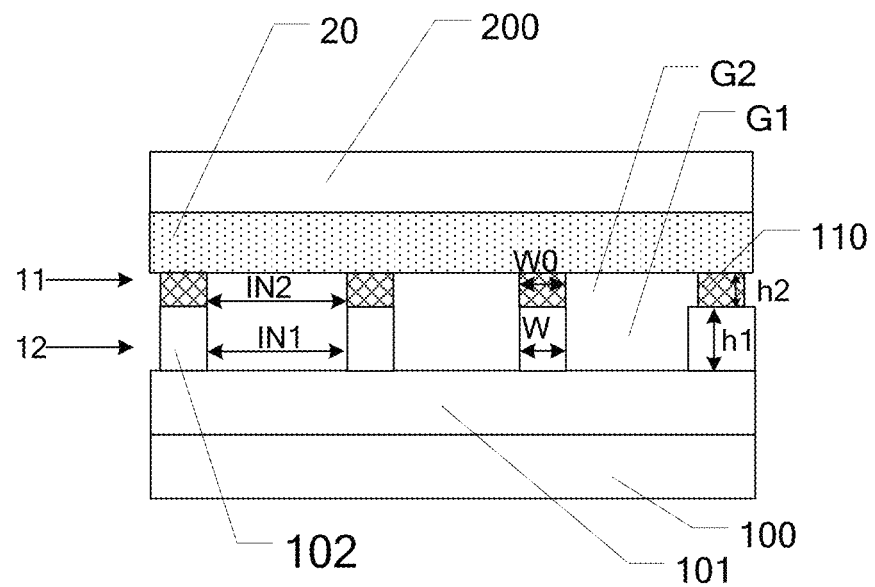
FIG. 5B is a cross-sectional view illustrating a display panel provided by another embodiment of the present disclosure.

FIG. 5B is a cross-sectional view illustrating a display panel provided by another embodiment of the present disclosure. Compared with the structure illustrated in FIG. 5A, FIG. 5B is described with reference to the case where a size W of the support portion 102 in the direction parallel with the first base substrate 100 is equal to a size W0 of the conductive line 110 in the direction parallel with the first base substrate 100.

Figure 6A:
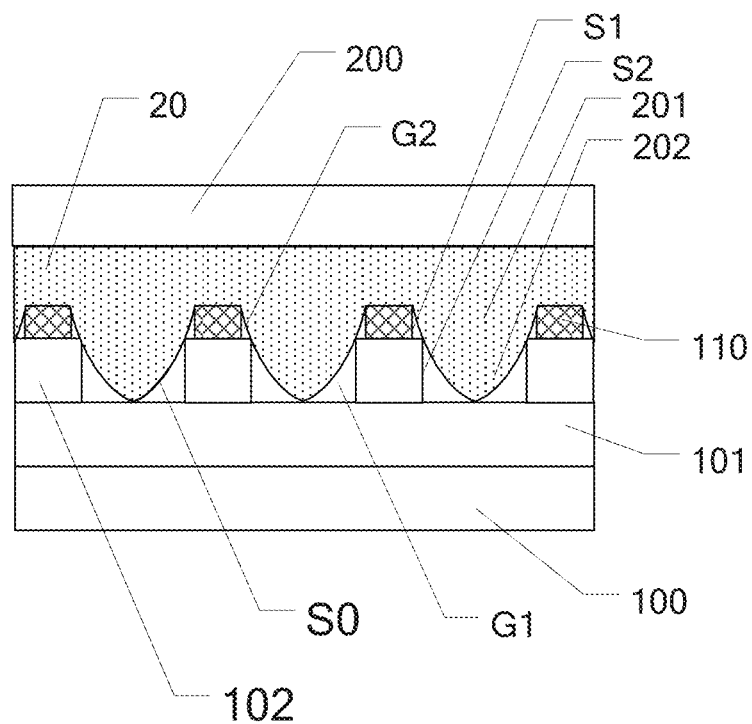
FIG. 6A to FIG. 6C are schematic sectional views illustrating display panels provided by some embodiments of the present disclosure.
Figure 6B:
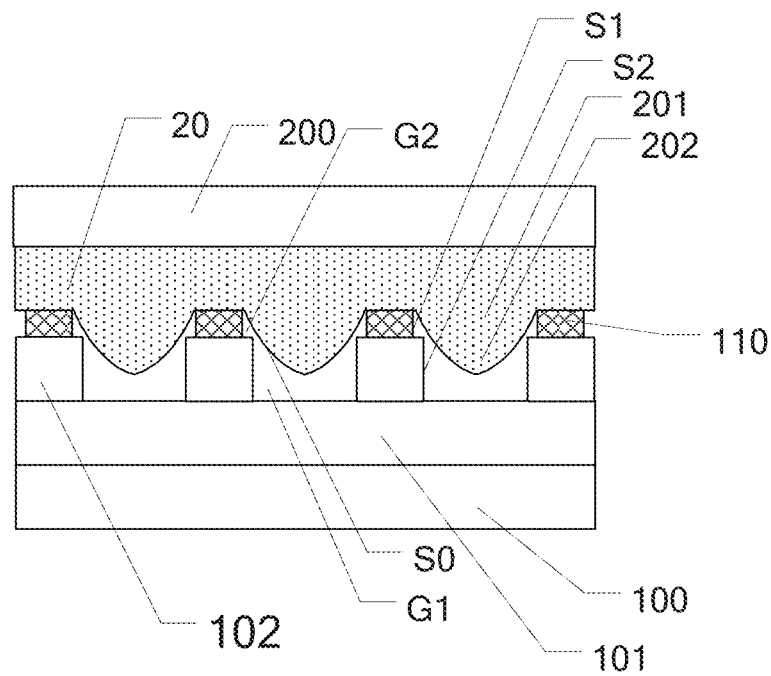
Figure 6C:
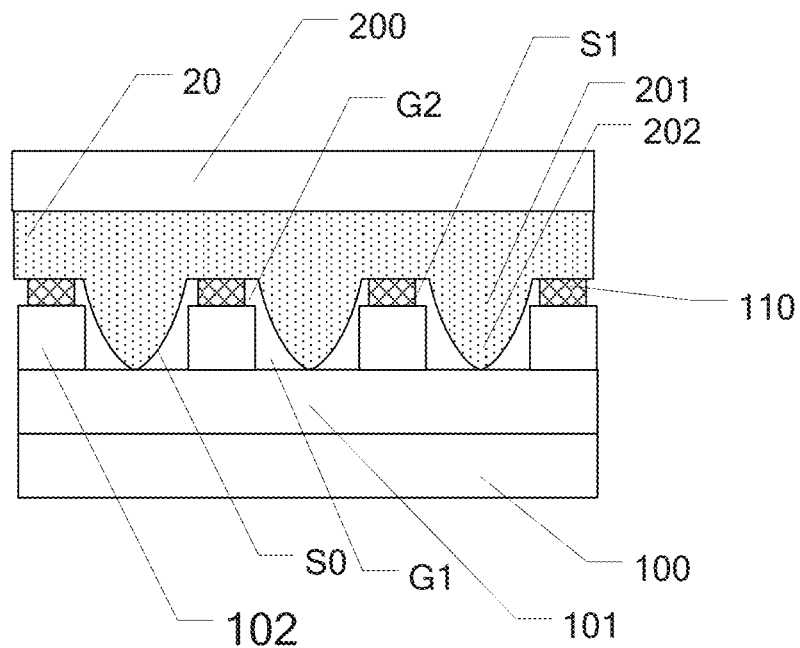

FIG. 6A-FIG. 6C are cross sectional views illustrating display panels provided by some embodiments of the present disclosure.

As illustrated in FIG. 6A, the packaging layer 20 includes not only a portion 201 located between opposite side surfaces S1 of adjacent conductive lines 110, but also a portion 202 located between opposite side surfaces S2 of adjacent support portions 102. A surface S0 of the packaging layer 20 close to the first base substrate 100 is in contact with the insulation layer 101. For example, the surface S0 of the packaging layer 20 close to the first base substrate 100 is in line contact (with reference to FIG. 2A) with the insulation layer 101. A gap G1 is provided between adjacent support portions 102 and a gap G2 is provided between adjacent conductive lines 110. The Gap G1 is not communicated with the gap G2.

As illustrated in FIG. 6B, the difference between the display panel provided by some embodiments and the display panel provided by the embodiment as illustrated in FIG. 6A is that a surface S0 of the packaging layer 20 close to the first base substrate 100 is not in contact with the insulation layer 101, and the gap G1 is communicated with the gap G2. For example, an interval is provided between the surface S0 of the packaging layer 20 close to the first base substrate 100 and the insulation layer 101.

As illustrated in FIG. 6C, the difference between the display panel provided by some embodiments and the display panel provided by the embodiment illustrated in FIG. 6A is that the gap G1 is communicated with the gap G2.

Figure 7A:
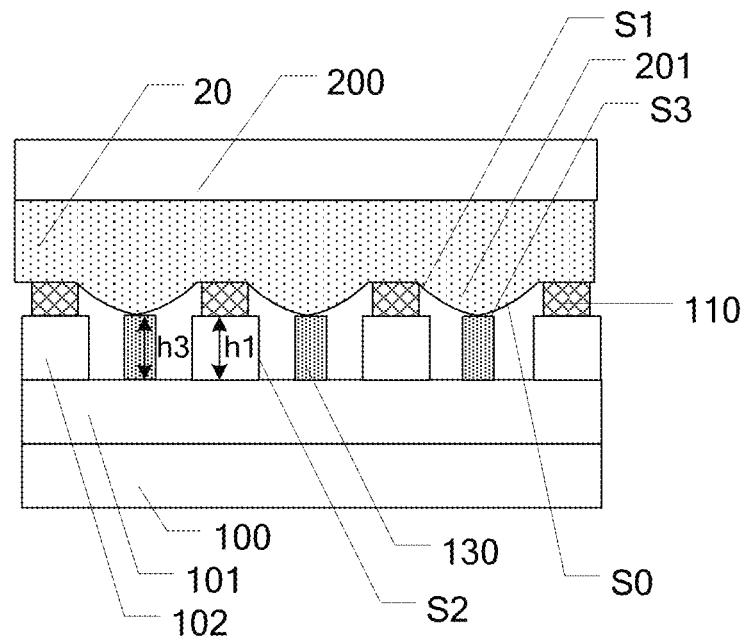
FIG. 7A-FIG. 7D are cross-sectional views illustrating display panels provided by other embodiments of the present disclosure.

FIG. 7A is a cross-sectional view illustrating a display panel provided by another embodiment of the present disclosure. As illustrated in FIG. 7A, a blocking portion 130 is further provided between opposite side surfaces S2 of adjacent support portions 102, and a surface S3 of the blocking portion 130 away from the first base substrate 100 is in contact with a surface S0 of the packaging layer 20 close to the first base substrate 100. For example, the blocking portion 130 is made of an insulation material. For example, the surface S0 of the packaging layer 20 close to the first base substrate 100 includes a convex surface, and a bottommost end of the surface S0 is in contact with the surface S3 of the blocking portion 130 away from the first base substrate 100. For example, the bottommost end of the surface S0 is in line contact (with reference to FIG. 2A) with the surface S3 of the blocking portion 130 away from the first base substrate 100. By arranging the blocking portion 130, the melted conductive lines can be separated to prevent the adjacent conductive lines from being contacted with each other, and a risk of a short-circuit between the adjacent conductive lines 110 is further reduced.

As illustrated in FIG. 7A, the packaging layer 20 includes only a portion 201 located between opposite side surfaces S1 of adjacent conductive lines 110. The packaging layer 20 does not include a portion located between opposite side surfaces S2 of adjacent support portions 102.

As illustrated in FIG. 7A, in some embodiments, a size h3 of the blocking portion 130 in a direction perpendicular to the first base substrate 100 is the same as a size h1 of the support portion 102 in a direction perpendicular to the first base substrate 100.

Figure 7B:
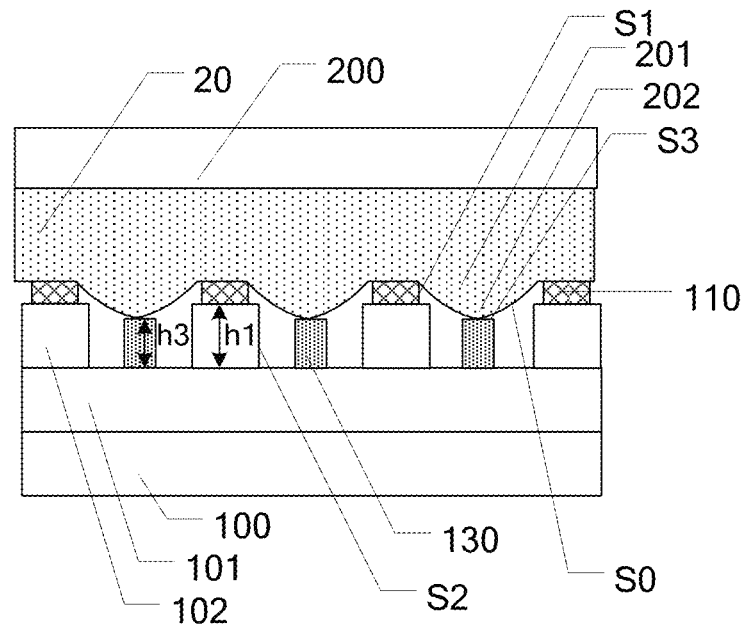

FIG. 7B is a cross-sectional view illustrating a display panel provided by another embodiment of the present disclosure. As illustrated in FIG. 7B, in some embodiments, a size h3 of the blocking portion 130 in a direction perpendicular to the first base substrate 100 is less than a size h1 of the support portion 102 in a direction perpendicular to the first base substrate 100. Compared with the embodiment illustrated in FIG. 7A, in the embodiment illustrated in FIG. 7B, the packaging layer 20 includes not only a portion 201 located between opposite side surfaces S1 of adjacent conductive lines 110, but also a portion 202 located between opposite side surfaces S2 of adjacent support portions 102.

Figure 7C:
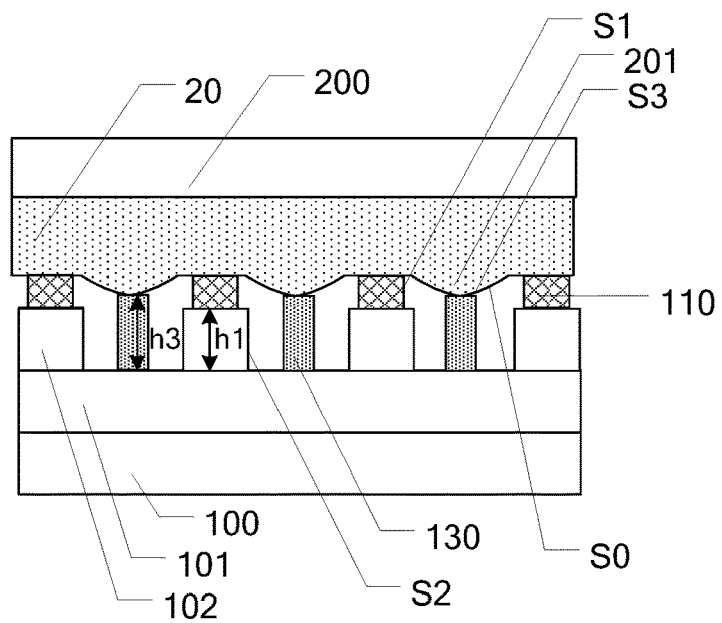

FIG. 7C is a cross-sectional view illustrating a display panel provided by another embodiment of the present disclosure. As illustrated in FIG. 7C, in some embodiments, a size h3 of the blocking portion 130 in a direction perpendicular to the first base substrate 100 is greater than a size h1 of the support portion 102 in a direction perpendicular to the first base substrate 100 as compared with the embodiment illustrated in FIG. 7A.

Figure 7D:
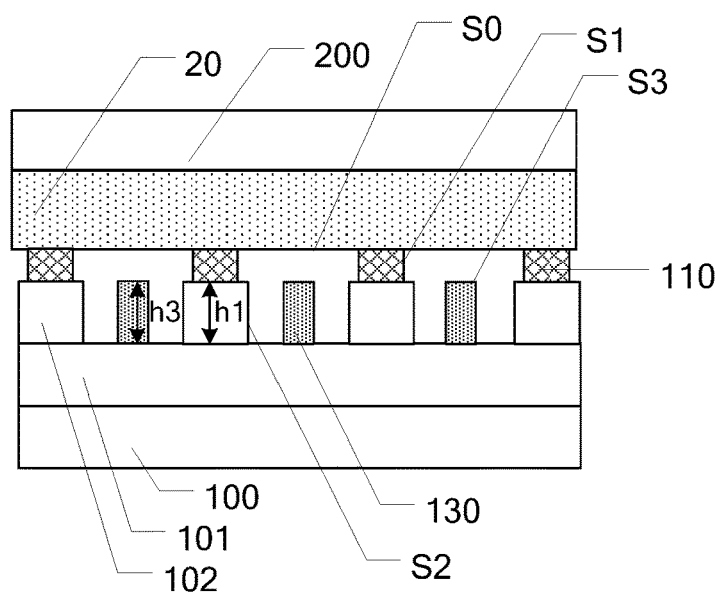

FIG. 7D is a cross-sectional view illustrating a display panel provided by another embodiment of the present disclosure. As illustrated in FIG. 7D, in some embodiments, a surface S0 of the packaging layer 20 close to the first base substrate 100 is not in contact with a surface S3 of the blocking portion 130 away from the first base substrate 100 as compared with the embodiment illustrated in FIG. 7A. An interval is provided between a surface S0 of the packaging layer 20 close to the first base substrate 100 and a surface S3 of the blocking portion 130 away from the first base substrate 100 in a direction perpendicular to the first base substrate 100. For example, in FIG. 7D, a size h3 of the blocking portion 130 in the direction perpendicular to the first base substrate 100 may be the same as or different from a size h1 of the support portion 102 in the direction perpendicular to the first base substrate 100. For example, a size h3 of the blocking portion 130 in the direction perpendicular to the first base substrate 100 may be greater than or less than a size h1 of the support portion 102 in the direction perpendicular to the first base substrate 100.

For example, the blocking portion 130 and the support portion 102 are formed from the same material by the same patterning process. In the case where a size of the blocking portion 130 and a size of the support portion 102 are different in a direction perpendicular to the first base substrate 100, the blocking portion 130 and the support portion 102 may be formed by using a double-tone mask.

At least one embodiment of the present disclosure further provides a manufacturing method of a display panel, including: forming a plurality of support portions in a packaging region of a first base substrate, a first interval being provided between adjacent support portions; forming a plurality of conductive lines at a side of the plurality of support portions away from the first base substrate; coating a liquid packaging material in the packaging region, the liquid packaging material being located at a side of the plurality of conductive lines away from the first base substrate; arranging the first base substrate and the second base substrate opposite to each other; and performing a heating process to solidify the liquid packaging material to form a packaging layer, so that the second base substrate is bonded with the first base substrate.

In some embodiments, the method further includes forming a blocking portion between opposite side surfaces of the adjacent support portions, and a surface of the blocking portion away from the first base substrate is in contact with a surface of the packaging layer close to the first base substrate.

In some embodiments, the blocking portion is formed simultaneously with forming the support portion. The support portion and the blocking portion may be formed by using the same patterning process.

In some embodiments, the method further includes forming an auxiliary layer, and the auxiliary layer may be configured to improve an adhesion force between the packaging layer and the first base substrate. Regarding the auxiliary layer, please refer to FIG. 2B and the related description.

The manufacturing method of the display panel provided by an embodiment of the present disclosure will be described below with reference to FIG. 8A-FIG. 8G.

Figure 8A:
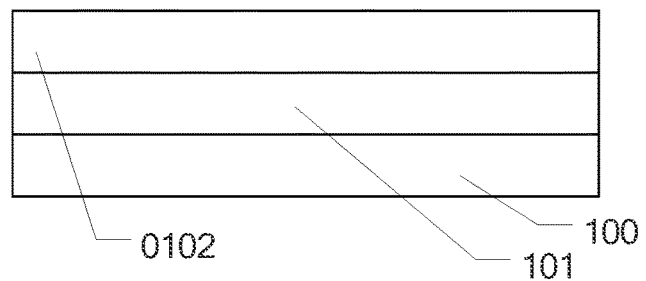
FIG. 8A-FIG. 8G are cross-sectional views illustrating a display panel during partial steps of a manufacturing method provided by an embodiment of the present disclosure.

Step S1: as illustrated in FIG. 8A, forming an insulation layer 101 and an insulation material layer 0102 sequentially on the first base substrate 100.

Figure 8B:
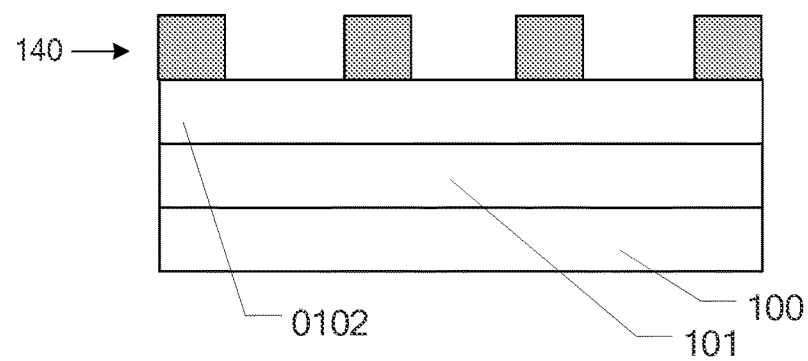

Step S2: as illustrated in FIG. 8B, forming a photoresist pattern 140 on the insulation material layer 0102. For example, the photoresist pattern 140 may be fabricated by forming a photoresist layer on the insulation material layer 0102, exposing and developing the photoresist layer to obtain the photoresist pattern 140.

Figure 8C:
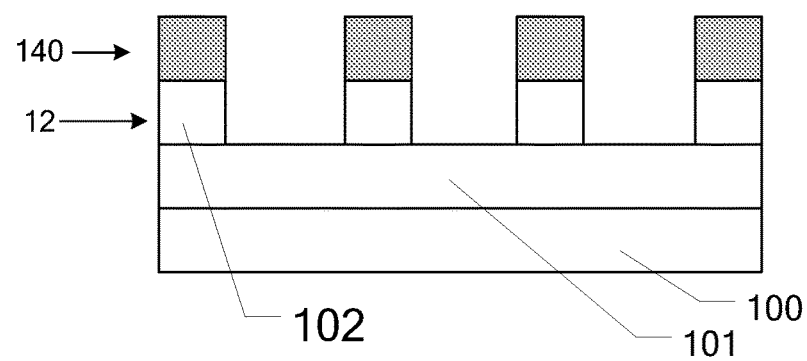

Step S3: as illustrated in FIG. 8C, etching the insulation material layer 0102 by using the photoresist pattern 140 as a mask to obtain the support layer 12 including a plurality of support portions 102.

Figure 8D:
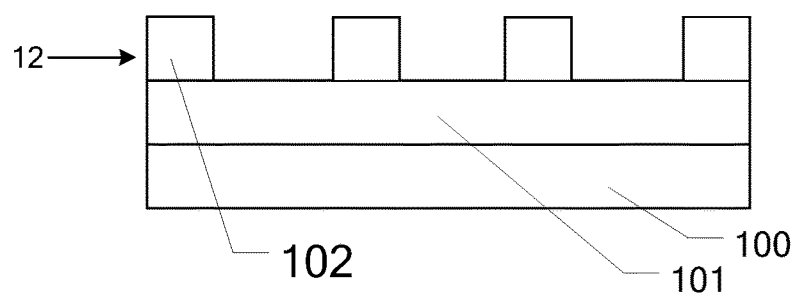

Step S4: as illustrated in FIG. 8D, striping the photoresist pattern 140.

Figure 8E:
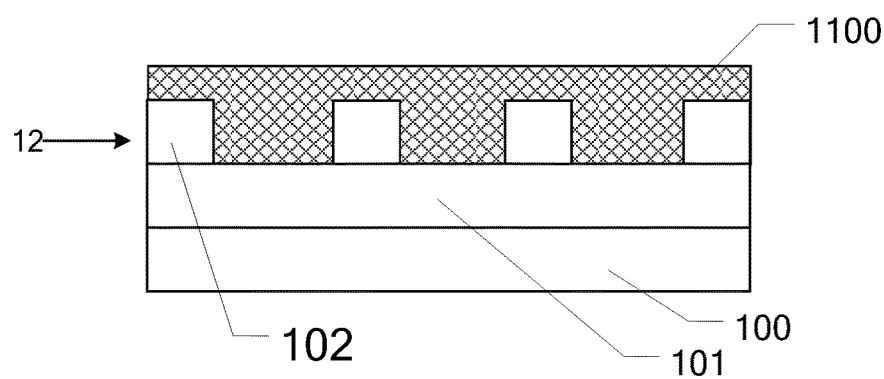

Step S5: as illustrated in FIG. 8E, forming a conductive line material layer 1100 on a structure as illustrated FIG. 8D.

Figure 8F:
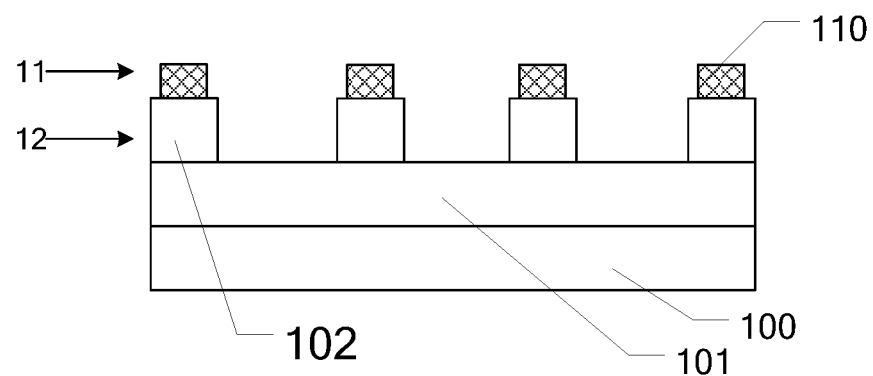

Step S6: as illustrated in FIG. 8F, patterning the conductive line material layer 1100 to form a conductive line layer 11 including a plurality of conductive lines 110. For example, the conductive line layer 11 including a plurality of conductive lines 110 is obtain by forming a photoresist layer on the conductive line material layer 1100, exposing and developing the photoresist layer to form a photoresist pattern, and etching the conductive line material layer 1100 by using the photoresist pattern as a mask.

Figure 8G:
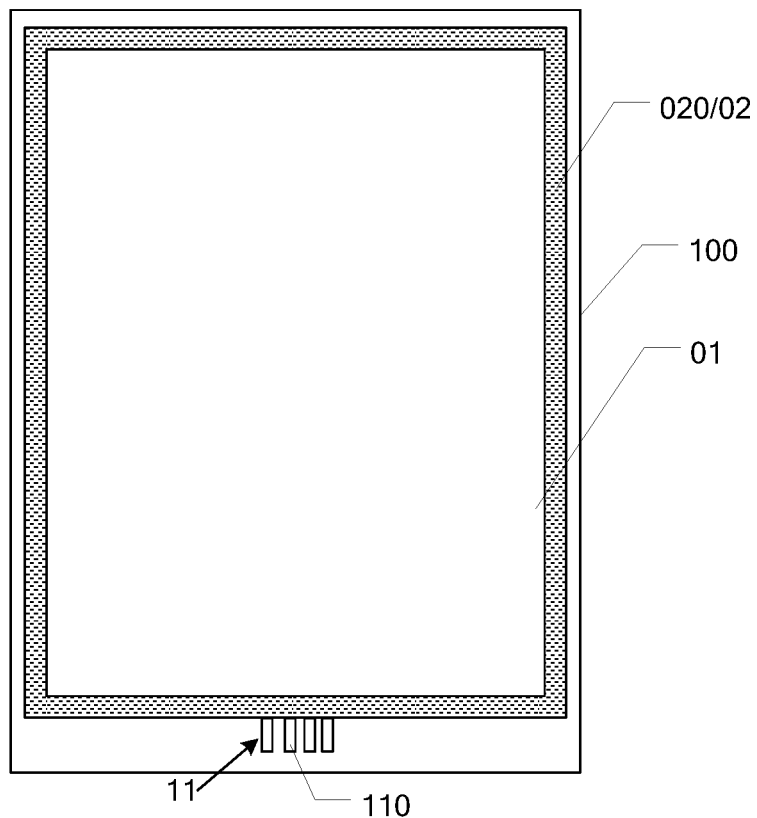

Step S7: as illustrated in FIG. 8G, coating a liquid packaging material 020 in a packaging region of the first base substrate 100.

Step S8: arranging the first base substrate 100 coated with liquid packaging material and a second base substrate opposite to each other, and performing a heating process (high temperature treatment) to solidify the liquid packaging material to form a packaging layer, so that the second base substrate is bonded with the first base substrate, and obtaining a display panel having been bonded after cooling.

For example, in the case where a size of the first interval IN1 in a direction perpendicular to the first base substrate is equal to a size of the second interval IN2 in a direction perpendicular to the first base, the support layer 12 including the plurality of support portions 102 may be formed by forming a conductive line material layer 1100 after forming an insulation material layer 0102, patterning the conductive line material layer 1100 to form a conductive line layer 11 including the plurality of conductive lines 110, and etching the insulation material layer 0102 by using the plurality of conductive lines 110 as a mask.

Figure 9:
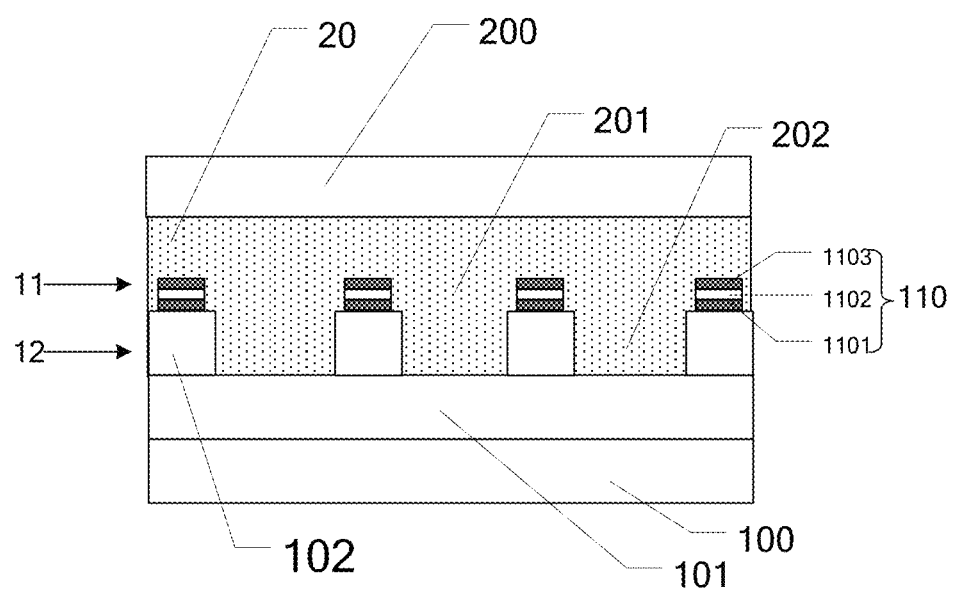
FIG. 9 is a cross-sectional view illustrating a display panel provided by an embodiment of the present disclosure.

FIG. 9 is a cross-sectional view illustrating a display panel provided by an embodiment of the present disclosure. The conductive line 110 includes a plurality of conductive sub-layers stacked in a direction perpendicular to the first base substrate 100. As illustrated in FIG. 9, the conductive line 110 includes three conductive sub-layers stacked in a direction perpendicular to the first base substrate 100, the three conductive sub-layers include a first conductive sub-layer 1101, a second conductive sub-layer 1102, and a third conductive sub-layer 1103 that are stacked sequentially from the first base substrate 100, a melting point of the second conductive sub-layer 1102 is less than a melting point of the first conductive sub-layer 1101 and a melting point of the third conductive sub-layer 1103, respectively. For example, the first conductive layer is made of titanium (Ti), the second conductive layer is made of aluminum (Al), and the third conductive layer is made of titanium (Ti). Conductive lines in other embodiments of the present disclosure may also refer to the structure illustrated in FIG. 9. Of course, other structures or other materials can also be used to form the conductive line.

At least one embodiment of the present disclosure provides a display device including any of the above display panels. For example, the display device may be an OLED display device.

It should be explained that, for the purpose of clarity only, in accompanying drawings for illustrating the embodiment(s) of the present disclosure, a layer or an area may be enlarged. It should be understood that, in the case in which a component such as a layer, a film, an area, a substrate or the like is referred to be "on" or "under" another component, it may be directly on or under the another component or a component is interposed therebetween.

In the embodiment of the present disclosure, patterning or a patterning process may include only a photolithography process, or include a photolithography process and an etching process, or may include other processes for forming a predetermined pattern, such as a printing process, an inkjet process, and the like. The photolithography process refers to a process including film formation, exposure, development, and the like to form a pattern by using a photoresist, a mask, an exposure machine, or the like. The corresponding patterning process can be selected in accordance with the structure formed in the embodiments of the present disclosure.

The above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising:
a first base substrate comprising a packaging region;
a plurality of support portions located in the packaging region, a first interval being provided between adjacent support portions;
a plurality of conductive lines located at a side of the plurality of support portions away from the first base substrate;
a packaging layer bonded to a side of the plurality of conductive lines facing away from the first base substrate; and
a second base substrate arranged opposite to the first base substrate and bonded with the first base substrate by the packaging layer, wherein the first base substrate is provided with an insulation layer on which the plurality of support portions are provided, a gap is provided between two adjacent support portions of the plurality of support portions, a boundary of the gap is defined by the insulation layer, the packaging layer, the two adjacent support portions, and two adjacent conductive lines of the plurality of conductive lines located on the two adjacent support portions, wherein the gap is a space completely filled with gas, and
wherein the packaging layer separates the gap from the second base substrate.

2. The display panel according to claim 1, wherein each of the plurality of support portions is in direct contact with one of the plurality of conductive lines, and the support portion is made of an insulation material.

3. The display panel according to claim 2, wherein an orthographic projection of the conductive line on the first base substrate falls within an orthographic projection of the support portion on the first base substrate.

4. The display panel according to claim 3, wherein an area of the orthographic projection of the conductive line on the first base substrate is less than or equal to an area of the orthographic projection of the support portion on the first base substrate.

5. The display panel according to claim 1, wherein the packaging layer comprises a portion located between opposite side surfaces of adjacent conductive lines.

6. The display panel according to claim 5, wherein the packaging layer further comprises a portion located between opposite side surfaces of the adjacent support portions.

7. The display panel according to claim 1, wherein a size of each of the plurality of support portions in a direction perpendicular to an upper surface of the first base substrate is greater than or equal to a size of each of the plurality of conductive lines in a direction perpendicular to the upper surface of the first base substrate.

8. The display panel according to claim 1, wherein a ratio of a size of each of the plurality of support portions in a direction parallel with an upper surface of the first base substrate to a distance between the adjacent support portions in a direction parallel with the upper surface of the first base substrate is 0.5-2.

9. The display panel according to claim 1, wherein a second interval is provided between adjacent conductive lines, and the second interval is greater than the first interval.

10. The display panel according to claim 9, wherein a blocking portion is further provided between opposite side surfaces of the adjacent support portions, and a surface of the blocking portion away from the first base substrate is in contact with a surface of the packaging layer close to the first base substrate, wherein the gap comprises two separate gaps that are provided between the adjacent support portions.

11. The display panel according to claim 1, wherein the first base substrate further comprises a display region, and the display region is surrounded by the packaging region.

12. The display panel according to claim 11, wherein a display component is located in the display region, and the display component is a component to be packaged.

13. A display device comprising the display panel according to claim 1.

14. The display panel according to claim 1, wherein the plurality of support portions are made of an insulation material.

15. The display panel according to claim 1, wherein a maximum size of the gap in a direction perpendicular to the first base substrate is equal to or less than a sum of a size of each of the plurality of support portions in a direction perpendicular to the first base substrate and a size of each of the plurality of conductive lines in a direction perpendicular to the first base substrate.

16. A display panel, comprising:
a first base substrate comprising a packaging region;
a plurality of support portions located in the packaging region, a first interval being provided between adjacent support portions;
a plurality of conductive lines located at a side of the plurality of support portions away from the first base substrate;
a packaging layer bonded to a side of the plurality of conductive lines away from the first base substrate; and
a second base substrate arranged opposite to the first base substrate and bonded with the first base substrate by the packaging layer,
wherein the first base substrate is provided with an insulation layer on which the plurality of support portions are provided, two separate gaps are provided between two adjacent support portions of the plurality of support portions, a boundary of each of the two separate gaps is defined by the insulation layer, the packaging layer, a support portion of the two adjacent support portions, and a conductive line of the plurality of conductive lines located on the support portion of the two adjacent support portions, and wherein each of the two separate gaps is a space completely filled with gas, and wherein the packaging layer separates the gap from the second base substrate.

17. The display panel according to claim 16, wherein the first base substrate is provided with an insulation layer on which the plurality of support portions are provided, a blocking portion is further provided between opposite side surfaces of the adjacent support portions, the blocking portion is in contact with the packaging layer, and a boundary of each of the two separate gaps is defined by the insulation layer, the packaging layer, one of the adjacent support portions, and one of the plurality of conductive lines located on the support portion.

* * * * *